United States Patent
Stevenson et al.

(10) Patent No.: US 8,530,984 B2
(45) Date of Patent: Sep. 10, 2013

(54) SEMICONDUCTOR DEVICE STRUCTURES AND THEIR FABRICATION

(71) Applicant: Texas Instruments Incorporated, Dallas, TX (US)

(72) Inventors: Clayton Lee Stevenson, Keller, TX (US); Jason C. Green, Richardson, TX (US); Daryl Ross Koehl, Garland, TX (US); Buu Quoc Diep, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/720,690

(22) Filed: Dec. 19, 2012

(65) Prior Publication Data

US 2013/0105995 A1    May 2, 2013

Related U.S. Application Data

(63) Continuation of application No. 13/603,007, filed on Sep. 4, 2012, now Pat. No. 8,343,805, which is a continuation of application No. 12/238,138, filed on Sep. 25, 2008, now Pat. No. 8,257,985.

(51) Int. Cl.
 *H01L 23/498* (2006.01)
 *H01L 29/84* (2006.01)

(52) U.S. Cl.
 USPC ..... 257/415; 257/678; 257/734; 257/E29.324

(58) Field of Classification Search
 USPC ............... 257/415–420, 683, 782–786, 680, 257/724, 686, 613, 678, 734
 See application file for complete search history.

(56) References Cited

U.S. PATENT DOCUMENTS

| | | | |
|---|---|---|---|
| 4,850,780 | A | 7/1989 | Safabakhsh et al. |
| 5,524,765 | A | 6/1996 | Gutentag |
| 5,953,590 | A | 9/1999 | Piper et al. |
| 6,884,650 | B2 | 4/2005 | Lee et al. |
| 7,135,385 | B1 | 11/2006 | Patwardhan et al. |
| 7,169,685 | B2 | 1/2007 | Connell et al. |
| 7,300,812 | B2 | 11/2007 | Chen et al. |
| 7,378,293 | B2 | 5/2008 | Diep |
| 7,943,489 | B2 | 5/2011 | Koehl et al. |
| 2002/0178567 | A1 | 12/2002 | Farnworth et al. |
| 2004/0129451 | A1 | 7/2004 | Wachtler |
| 2005/0059188 | A1 | 3/2005 | Bolken et al. |
| 2005/0093170 | A1 | 5/2005 | Kalidas et al. |
| 2005/0095835 | A1 | 5/2005 | Humpston et al. |
| 2005/0176166 | A1 | 8/2005 | Chen et al. |
| 2005/0202651 | A1 | 9/2005 | Akram |
| 2006/0286707 | A1 | 12/2006 | Hooper et al. |
| 2007/0035807 | A1 | 2/2007 | DiCarlo et al. |

*Primary Examiner* — Savitr Mulpuri
(74) *Attorney, Agent, or Firm* — Warren L. Franz; Wade J. Brady, III; Frederick J. Telecky, Jr.

(57) ABSTRACT

A method and structure for uncovering captive devices in a bonded wafer assembly comprising a top wafer and a bottom wafer. One embodiment method includes forming a plurality of cuts in the top wafer and removing a segment of the top wafer defined by the plurality of cuts. The bottom wafer remains unsingulated after the removal of the segment.

8 Claims, 9 Drawing Sheets

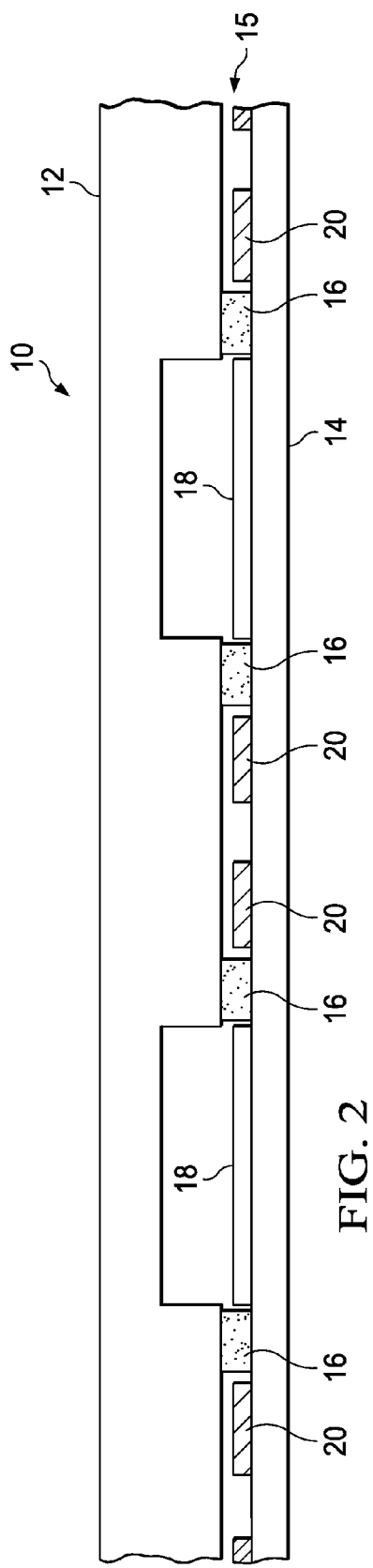
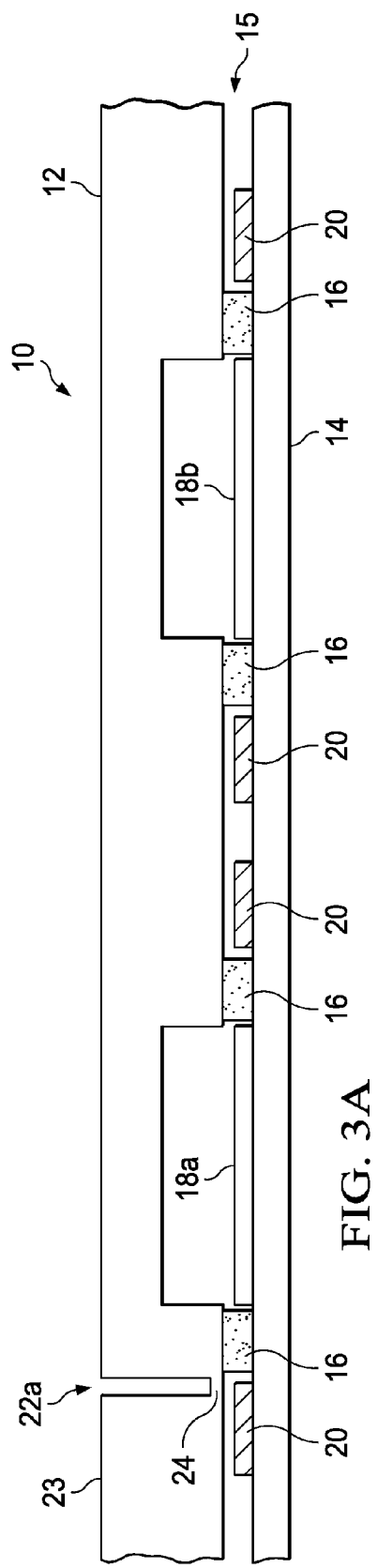

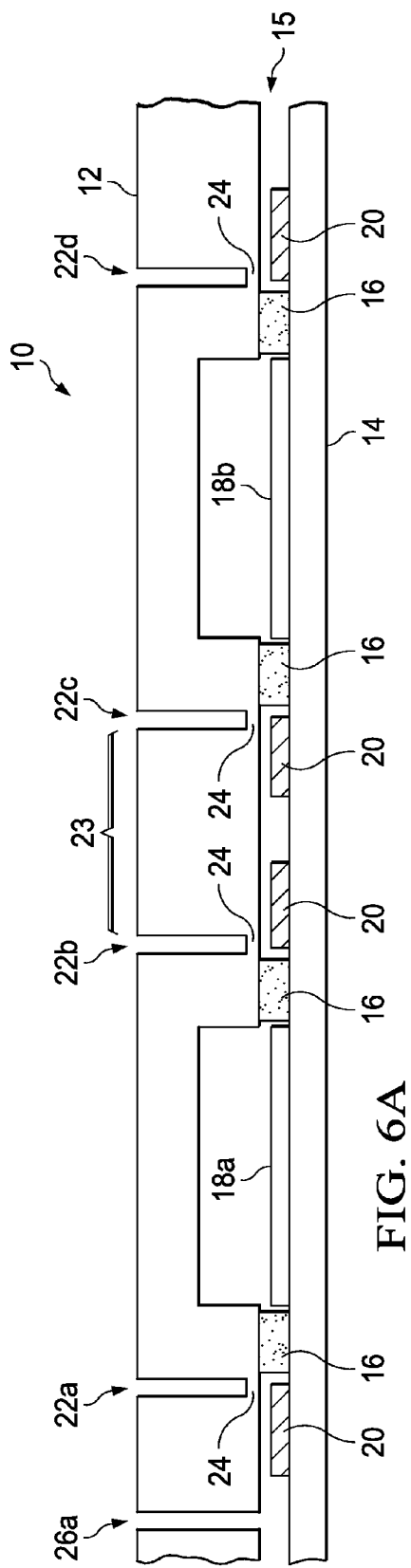
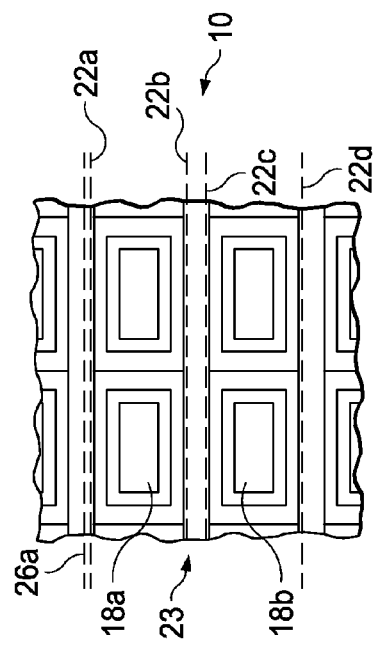

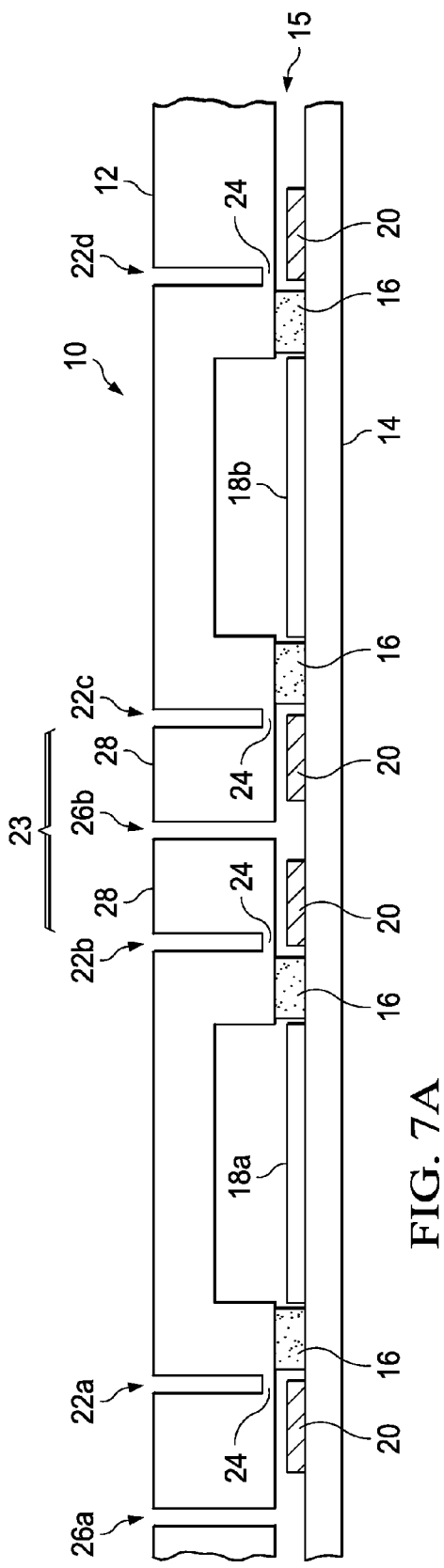
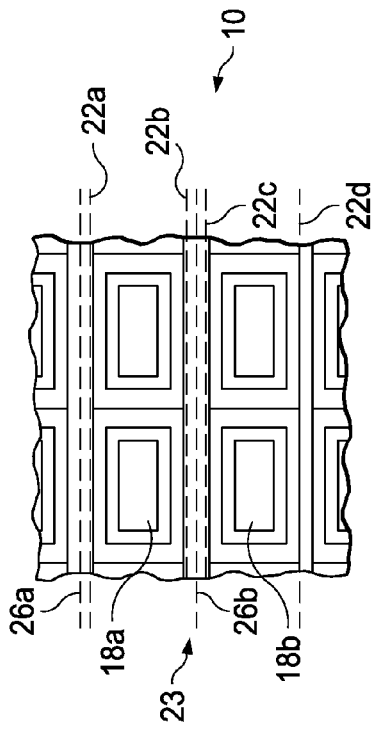

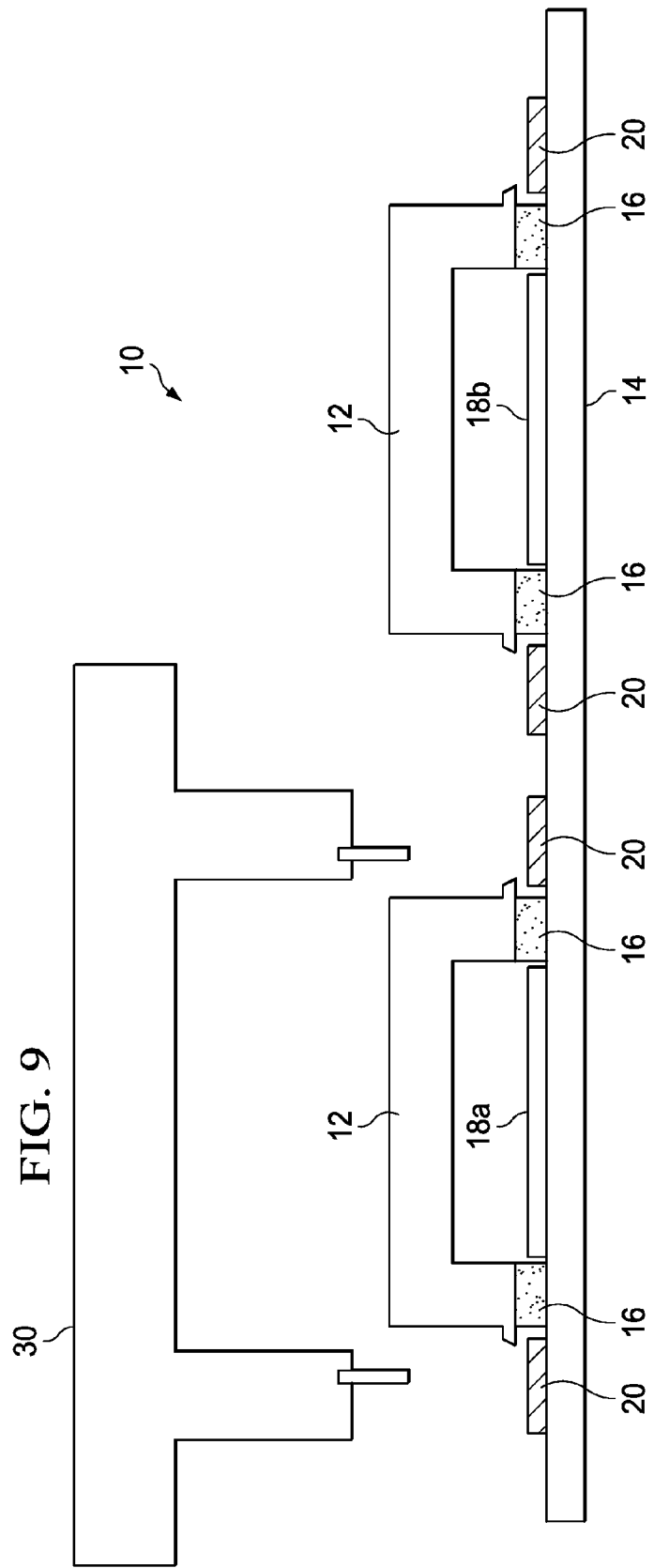

SEMICONDUCTOR DEVICE STRUCTURES AND THEIR FABRICATION

This is a continuation of application Ser. No. 13/603,007 filed Sep. 4, 2012 (now U.S. Pat. No. 8,343,805), which is a continuation of application Ser. No. 12/238,138 filed Sep. 25, 2008 (now U.S. Pat. No. 8,257,985), and discloses subject matter related to the subject matter of application Ser. No. 12/238,038 filed Sep. 25, 2008 (now U.S. Pat. No. 7,943,489), the entireties of all of which are incorporated herein by reference.

BACKGROUND

Embodiments of the invention relate to semiconductor device structures and their fabrication, and more particularly to device structures and methods for uncovering captive structures on a bonded wafer assembly.

In the production of semiconductor devices, and particularly in the production of microelectromechanical system (MEMS) devices, chips are produced in an array oftentimes having as many as thirty or more devices on a single wafer. Typically, these devices are formed on a first wafer, and then a second wafer is bonded to the first wafer. Cavities may be formed between the wafers in various areas, for example above the MEMS components or above the bond pads. After the wafers are bonded together, the bond pads, or other structures to which access is desired for further testing and processing, are completely covered by the top wafer. These structures generally need to be exposed prior to testing and processing of the embedded devices.

Previously, singulation of these devices was performed to separate the devices from each other and expose the bond pads prior to the testing and processing of the devices. In previous methods, the wafer assembly would be completely singulated into individual devices, and the individual devices would be arranged and held in place on a tape for testing and processing. The devices may be singulated either before or after being placed on the tape.

The use of a tape in such a process may give rise to various problems. In particular, the shifting of chips on the tape may cause alignment problems with a testing probe or other equipment. Such problems tend to increase test time due to extensive wafer alignment measurements, and also tend to increase the downtime during testing resulting from misalignment. Both of these factors may contribute to increased cost of semiconductor production.

SUMMARY

Example embodiments of the invention are described in which captive structures of semiconductor devices in a bonded wafer assembly are uncovered while the semiconductor devices remain together, unsingulated, in the wafer assembly.

In accordance with a preferred embodiment, a method for uncovering captive structures in a bonded wafer assembly comprises forming a plurality of microelectromechanical (MEMS) devices and rows of contact zones on a bottom wafer, bonding a top wafer to the bottom wafer, thereby covering the MEMS devices and contact zones, cutting a plurality of linear cuts in the top wafer between adjacent MEMS devices and parallel to the rows of contact zones, and removing a segment of the top wafer defined by the plurality of cuts, wherein the bottom wafer remains unsingulated, wherein at least one of the rows of contact zones is uncovered, and wherein the adjacent MEMS devices remain covered.

In accordance with another preferred embodiment, a MEMS bonded wafer assembly comprises an unsingulated bottom wafer, an array of MEMS devices disposed on the bottom wafer, the array having columns and rows, at least one row of bond pads disposed on the bottom wafer for each of the rows of MEMS devices, a top wafer bonded to the bottom wafer in a perimeter around each of the MEMS devices, and between the MEMS devices and their associated bond pads, wherein the top wafer is partially singulated into rows, each top wafer row covering a respective row of the rows of MEMS devices as well as regions between the MEMS devices in the respective row, and wherein the top wafer does not cover the bond pads.

In accordance with another preferred embodiment, a method of processing a MEMS bonded wafer assembly comprises forming a plurality of parallel partial cut pairs extending only partially through a top wafer, forming a plurality of parallel full cuts extending fully through the top wafer and between respective partial cut pairs, removing segments of the top wafer defined by the partial cut pairs, the segments overlying the captive structures disposed therebeneath on a bottom wafer, and processing at least one of the captive structures while the bottom wafer remains unsingulated.

An advantage of an embodiment is that MEMS devices may be tested and further processed without singulation of the wafer. Another advantage of an embodiment is that the alignment and cost issues of associated with previous methods may be avoided.

BRIEF DESCRIPTION OF THE DRAWINGS

FIG. 2 is a section view of the bonded wafer assembly of FIG. 1 taken along section line A-A;

FIGS. 3A, 4A, 5A, 6A, 7A and 8A are section views as in FIG. 2 of the bonded wafer assembly at respective subsequent steps in production;

FIGS. 3B, 4B, 5B, 6B, 7B and 8B are top views of the bonded wafer assembly at the same respective subsequent steps in production;

FIG. 9 is a section view of a bonded wafer assembly during testing of a captive structure.

DETAILED DESCRIPTION OF EXAMPLE EMBODIMENTS

Various embodiments are discussed with reference to the accompanying drawings. It should be appreciated that the invention provides many applicable inventive concepts that can be embodied in a wide variety of specific contexts. The specific embodiments discussed herein are merely illustrative of specific ways to make and use the invention, and do not limit the scope of the invention.

The invention is described with respect to preferred embodiments in a specific context, namely the fabrication of a particular microelectromechanical system (MEMS) device formed on a silicon wafer with a glass cover or cover assembly that includes a glass cover wafer, as used in, for example, a digital micromirror device (DMD). The concepts may also be applied, however, to other MEMS structures and make use of other materials as well. For example, the MEMS devices may be other spatial light modulators, other optical devices such as optical switches, mechanical or electrical switches, mechanical transducers such as pressure sensors, accelerometers, piezoelectric sensors, gyroscopes, biosensors, chemical sensors, chemical reactors, electrostatic actuators, micromotors, microrelays, fluidic devices such as pneumatic valves, membrane pumps, flow sensors, etc.

With respect to DMDs (and as fully explained in Diep U.S. Pat. No. 7,378,293, entitled "MEMS Fabrication Method," issued May 27, 2008, which is hereby incorporated herein by reference), DMD MEMS devices may be formed by bonding a glass cover to a semiconductor wafer containing the MEMS components, circuitry, bond pads, etc. Prior art methods for wafer singulation use a partial saw and break method. That is, a saw cut creates a fault line so that the dice may be separated using an impact tool. U.S. Pat. No. 7,378,293 also teaches a partial saw and full saw method. That is, a first saw cut is made partially into the cover, and a second saw cut is made all the way through the cover and the wafer to separate the dice. In either approach, singulation of the wafer assembly into individual dice is followed by removal of the swizzle sticks (in these examples the portion of the cover that is covering the bond pads) to expose the bond pads. Testing and further processing of the dice then may be performed. Further details for DMD device structures, applications, and processes (e.g., sawing and glass removal) are disclosed in U.S. Pat. No. 7,378,293.

Figure 1:
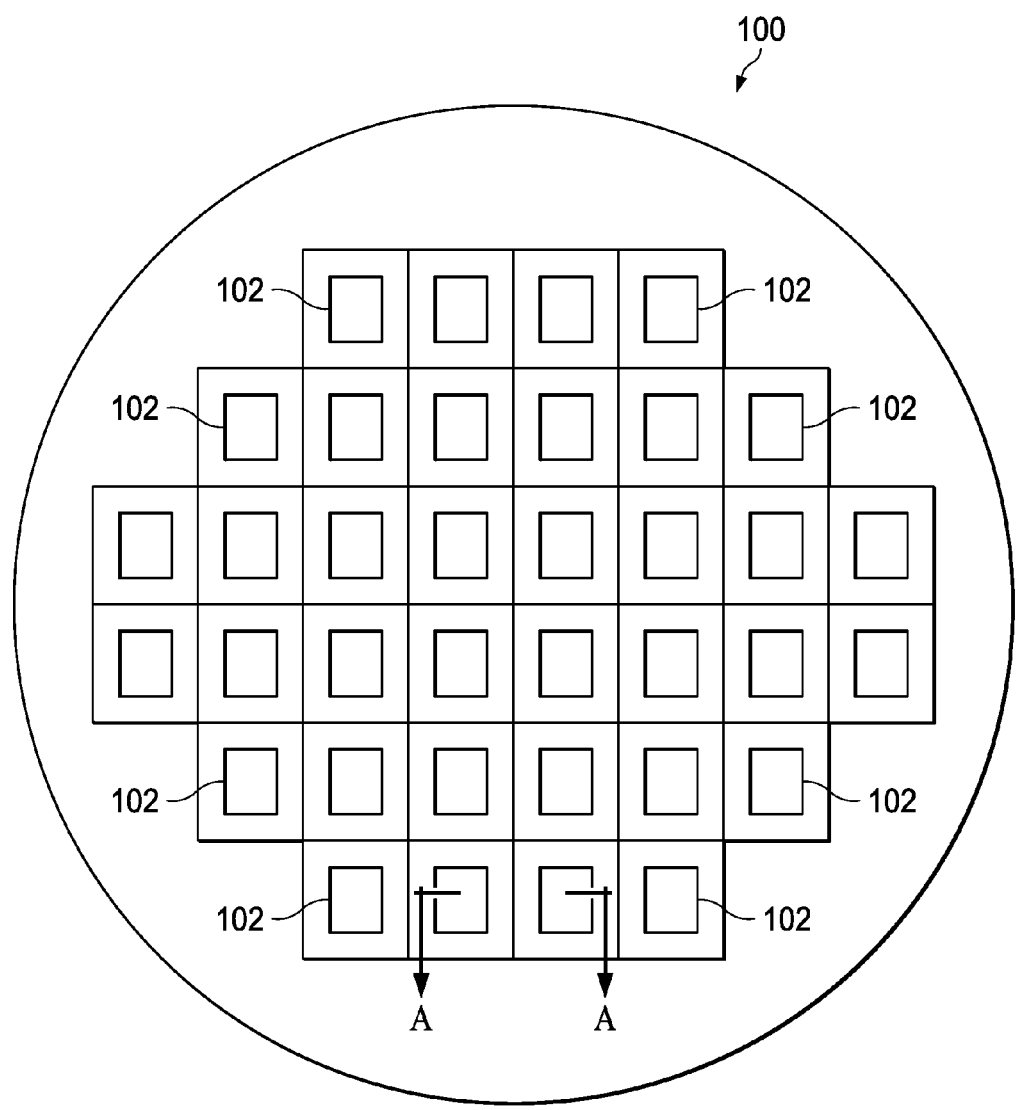
FIG. 1 is a top view of a bonded wafer assembly having a plurality of devices disposed thereon.

Referring now to FIG. 1, there is shown a wafer 100 populated with a plurality of laterally spaced devices 102. By way of example, FIG. 1 shows the wafer 100 to be populated with thirty-six devices 102. Alternatively, fewer devices may be used, or a much greater number of devices 102 may be used in other embodiments. As can be seen in FIG. 1, the arrangement of the devices 102 upon the surface of the wafer 100 creates a grid-like pattern having both horizontal rows and vertical columns. Note that only the horizontal rows are shown in the subsequent figures, with the vertical columns being omitted for clarity. Note also that the terms "horizontal rows" and "vertical columns" are used herein for convenience, but are arbitrarily chosen and distinguishable only relative to one another unless otherwise noted or apparent from the context.

Referring next to FIG. 2, there is shown a bonded wafer assembly 10 that includes a top wafer 12 and a bottom wafer 14. The view of bonded wafer assembly 10 shown in FIG. 2 and in corresponding subsequent figures represents a section of the wafer 100 taken along the section line A-A of FIG. 1. The top wafer 12 and the bottom wafer 14 are joined by way of a series of adhesive pads 16 disposed in an interstitial space 15 between wafers 12, 14. In a typical embodiment, the top wafer 12 has a thickness of approximately 1 millimeter and is constructed from an appropriate semiconductor processing material. Such a material could be, for example, glass, silicon, or gallium arsenide. Furthermore, the top wafer 12 may be of unitary construction, or may be an assembly of multiple layers or substrates. The bottom wafer 14 may also be constructed of any appropriate semiconductor material such as, for example, silicon or gallium arsenide. Also disposed in the interstitial space 15 is at least one device 18. By way of example, the device 18 is illustrated in FIG. 1 as being a microelectromechanical system (MEMS) type device, and in particular a digital micromirror device (DMD). However, the device 18 may be any appropriate integrated circuit device. The device 18 typically includes a set of contact zones 20, e.g., comprising bonding pads, disposed proximate to, and on either side of, the device 18.

Figure 3B:
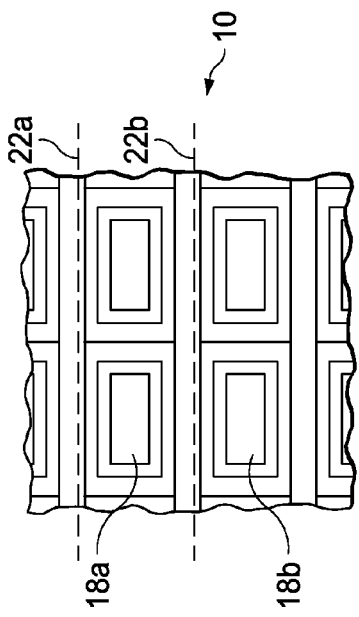

Referring next to FIGS. 3A and 3B, a first partial cut 22a is made in the top wafer 12. By way of example, the first cut 22a is shown in FIG. 3A as being positioned on the left side of the device 18a on the outside of the adhesive pads 16. The first cut 22 may be made by any appropriate means such as, for example, a rotating or reciprocating saw. The first cut 22a generally should be formed in such a way so as to ensure an accurate and consistent depth. The first cut 22a typically has a width in the range of approximately 50 microns to approximately 100 microns, although other dimensions may be used for this and the other cuts described herein. As illustrated in FIG. 3A, the first cut 22a does not cut all the way through the top wafer 12. Rather, the first cut 22a only cuts partially through the top wafer 12 leaving a tab 24 holding the segment 23 in place. The tab 24 typically has a thickness in the range of about 30 microns to about 80 microns, but may be other dimensions depending on the specific application. As shown in FIG. 3B, the first cut 22a extends down the full length of the bonded wafer assembly 10.

Figure 4B:
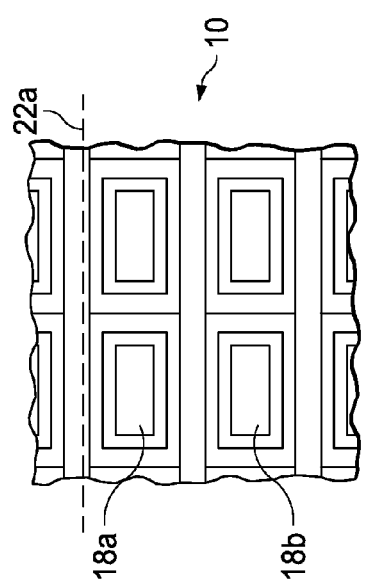
Figure 4A:
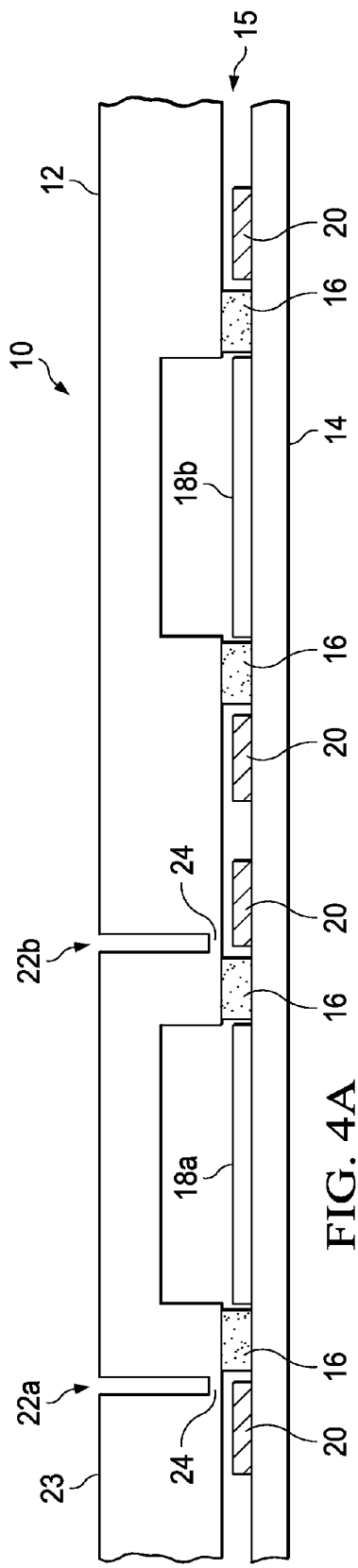

Referring next to FIGS. 4A and 4B, the process continues by making a second partial cut 22b in the top wafer 12. By way of example, the second cut 22b is shown in FIG. 4A as being positioned on the right side of the device 18a, and on the outside of the adhesive pads 16. The second cut 22b may be made by any appropriate means such as, for example, a rotating or reciprocating saw. The second cut 22b generally should be formed in such a way so as to ensure an accurate and consistent depth. Similar to the first cut 22a, the second cut 22b typically has a width in the range of approximately 50 microns to approximately 100 microns. As illustrated in FIG. 4A, the second cut 22b also does not cut all the way through the top wafer 12. Rather, the second cut 22b only cuts partially through the top wafer 12 leaving a tab 24. The tab 24 typically has a thickness in the range of about 30 microns to about 80 microns. As shown in FIG. 4B, the second cut 22b extends down the full length of the bonded wafer assembly 10.

Figure 5A:
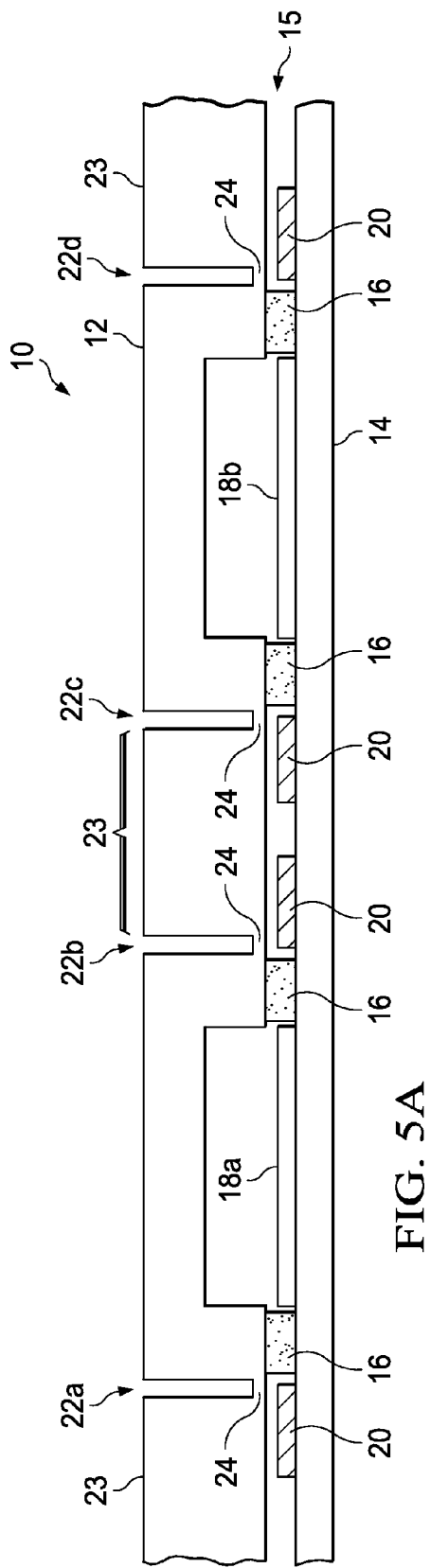
Figure 5B:
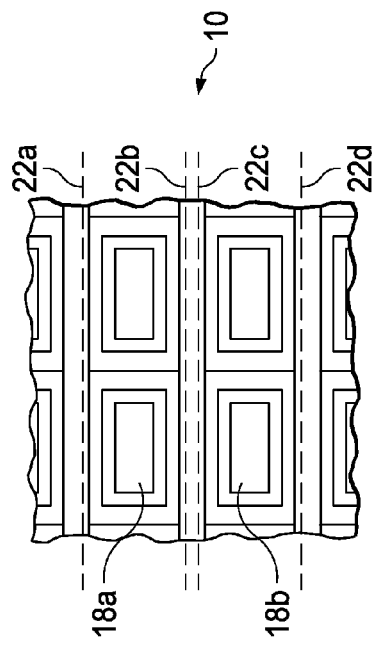

Referring next to FIGS. 5A and 5B, the process continues by making a third partial cut 22c and fourth partial 22d in the top wafer 12. By way of example, the third cut 22c is shown in FIG. 5A as being positioned on the left side of the device 18b, and on the outside of the adhesive pads 16. Likewise, the fourth partial cut 22d is shown by way of example as being located on the right side of device 18b and on the outside of the adhesive pads 16. The third and fourth cuts 22c and 22d may be made by any appropriate means such as, for example, a rotating or reciprocating saw. The third and fourth cut 22c and 22d generally should be formed in such a way so as to ensure an accurate depth that is consistent with the first and second cuts 22a and 22b. Similar to the first and second cuts 22a and 22b, the third and fourth cuts 22c and 22d typically have a width in the range of approximately 50 microns to approximately 100 microns. As illustrated in FIG. 5A, the third and fourth cuts 22c and 22d also do not cut all the way through the top wafer 12. Rather, the third and fourth cuts 22c only cut partially through the top wafer 12 leaving a tab 24 holding the segment 23 in place. The tab 24 typically has a thickness in the range of about 30 microns to about 80 microns. As shown in FIG. 5B, the third and fourth cuts 22c and 22d extends down the full length of the bonded wafer assembly 10.

By way of example only, FIGS. 3A-5B illustrate four partial cuts 22a-22d being made in the top wafer 12. In practice, any number of partial cuts could be performed depending upon on the number of devices, the number of captured structures to be uncovered, the application, etc.

Referring next to FIGS. 6A and 6B, there is shown the bonded wafer assembly 10 in the next phase of manufacturing. As shown in FIG. 6A, a first complete cut 26a is made in the top wafer 12. The first complete cut 26a extends entirely through the top wafer 12, but does not reach the bottom wafer 14, leaving the bottom layer 14 intact. Alternatively, for the complete cuts, the bottom wafer may be partially cut into, as long as the bottom wafer is not singulated. By way of example, the first complete cut 26a is shown in FIG. 6A as being located to the left of the first partial cut 22a, and on the outside of the contact zone 20. Similar to the partial cuts 22a-22d, the first complete cut 26a may be made by any appropriate means such as, for example, a rotating or reciprocating saw. The first complete cut 26a generally should be formed in such a way so as to ensure an accurate and consistent depth. Similar to the partial cuts 22a-22d, the first complete cut 26a typically has a width in the range of approximately 50 microns to approximately 100 microns. As shown in FIG. 6B, the first complete cut 26a extends down the full length of the bonded wafer assembly 10.

Referring next to FIGS. 7A and 7B, the process continues by making a second complete cut 26b in the top wafer 12. The second complete cut 26b extends entirely through the top wafer 12, but leaves the bottom layer 14 intact. By way of example, the second complete cut 26b is shown in FIG. 7A as being located between second and third partial cuts 22b and 22c. The second complete cut 26b is positioned so as to approximately bisect segment 23 into segment halves or swizzle sticks 28. Typically, each swizzle stick 28 has a width in the range of approximately 400 microns to approximately 800 microns, although other dimensions may be used depending on the application. Similar to the partial cuts 22a-22d, the second complete cut 26b may be made by any appropriate means such as, for example, a rotating or reciprocating saw. The second complete cut 26b generally should be formed in such a way so as to ensure a depth that is accurate and consistent with the first complete cut 26a. Similar to the partial cuts 22a-22d, the second complete cut 26b typically has a width in the range of approximately 50 microns to approximately 100 microns. As shown in FIG. 7B, the second complete cut 26b extends down the full length of the bonded wafer assembly 10.

Figure 8A:
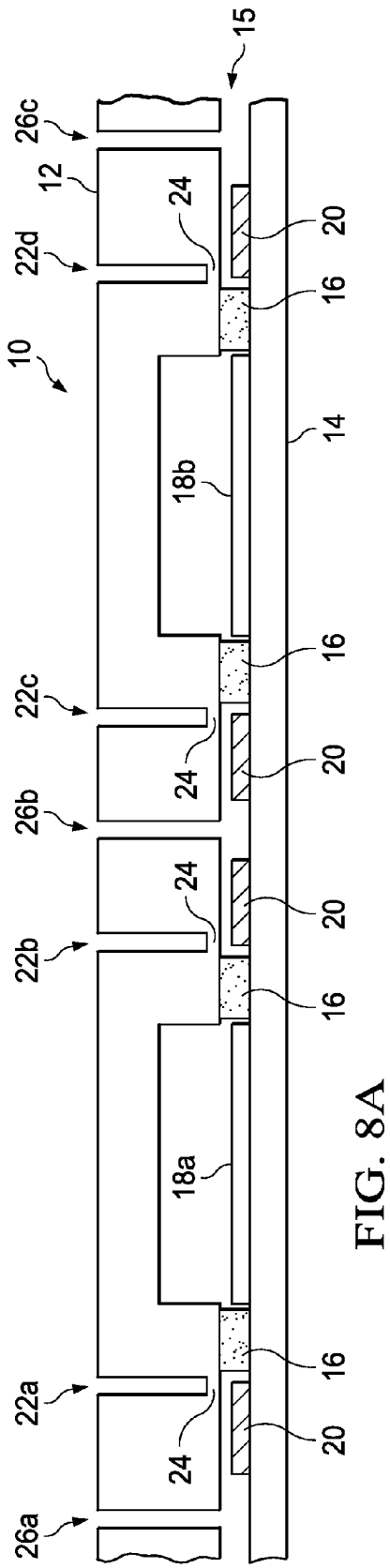
Figure 8B:
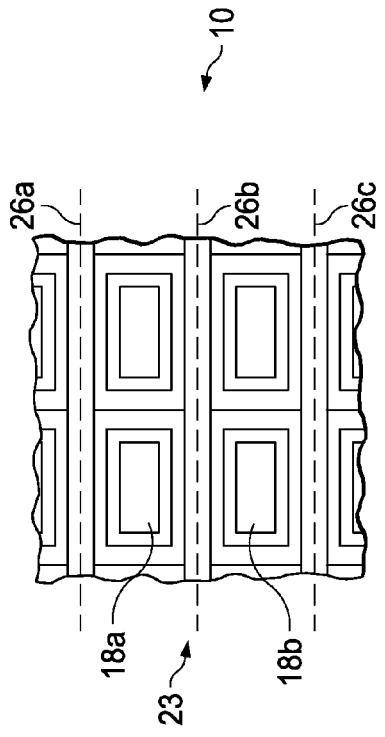

Referring next to FIGS. 8A and 8B, the process continues by making a third complete cut 26c in the top wafer 12. The third complete cut 26c extends entirely through the top wafer 12, but leaves the bottom layer 14 completely intact. By way of example, the third complete cut 26c is shown in FIG. 8A as being located to the right of the fourth partial cut 22d, and on the outside of the contact zone 20. Similar to the partial cuts 22a-22d, the third complete cut 26c may be made by any appropriate means such as, for example, a rotating or reciprocating saw. The third complete cut 26c generally should be formed in such a way so as to ensure a depth that is accurate and consistent with first and second complete cuts 26a and 26b. Similar to the partial cuts 22a-22d, the third complete cut 26c typically has a width in the range of approximately 50 microns to approximately 100 microns. As shown in FIG. 8B, the third complete cut 26c extends down the full length of the bonded wafer assembly 10.

By way of example only, FIGS. 6A-8B illustrate three complete cuts 26a-26c being made in the top wafer 12. In practice, any number of complete cuts could be performed depending upon on the number of devices, the number of captured structures to be uncovered, the application, etc. For example, a complete cut may be made between every pair of devices on the bottom wafer, and two partial cuts may be made for each complete cut. In yet another embodiment, the complete cuts 26 may be formed instead as partial cuts similar to the other partial cuts 22 formed in the top wafer 12, thus forming three partial cuts on the top wafer 12 between adjacent rows of die. There would then be three sets of tabs formed between adjacent rows of die, typically with thicknesses in the range of about 30 microns to about 80 microns, although may be other dimensions depending on the specific application. For example, the middle partial cut may be deeper than the others, with the tab being correspondingly thinner, such as about 40 microns or less. Alternatively, there may be a different number of cuts other than three between adjacent die. In some embodiments there may be only two partial cuts as shown in FIG. 5A, or one of those cuts may be a complete cut. Alternatively there may be more than three cuts, such as four or five cuts, in any combination of partial and complete cuts.

Referring now to FIG. 9, there is shown the bonded wafer assembly 10 with the swizzle sticks 28 removed, thereby exposing the contact zones 20. As can be seen in FIG. 9 the portion of the top wafer 12 covering the device 18a remains intact while the portion of the top wafer 12 previously concealing the contact zones 20 has been removed. Furthermore, FIG. 9 illustrates that the bottom wafer 14 remains unsingulated after removal of the swizzle sticks 28. The removal of the swizzle sticks 28 allows access to the contact zones for processing or testing of the devices 18. By way of example, this processing or testing is illustrated in FIG. 9 with a probe card 30 being used to contact, e.g., bond pads in the contact zones 20.

Figure 10:
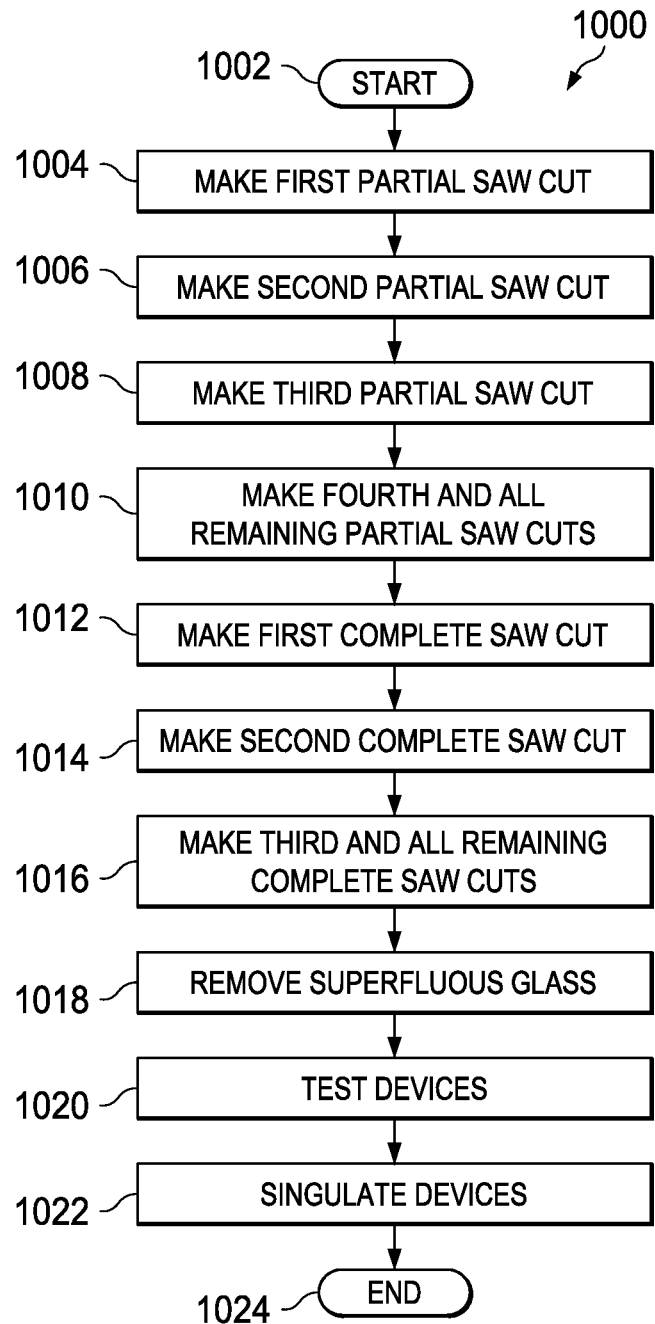
FIG. 10 is a flow diagram of a process for gaining access to captive structures in a bonded wafer assembly.

Referring next to FIG. 10, there is shown a process 1000 for gaining access to captive structures in a bonded wafer assembly without singulation. The process 1000 begins at step 1002, in which a first partial saw cut is made. In steps 1004-1010, all subsequent partial saw cuts are made. Next, a first complete saw cut is made at step 1012 with all subsequent complete saw cuts being made in steps 1014 and 1016. In a typical embodiment, the cuts made in steps 1002-1016 will run in the same direction and will be roughly parallel to each other resulting in, for example, a series of longitudinal or column cuts in the surface of the wafer. In one embodiment, the cuts may be made parallel to columns of contact zones disposed on a bottom wafer. The cutting steps in FIG. 10 may be performed in any order. For example, all partial cuts may be done first, followed by full cuts. Alternatively, the full cuts may be done before the partial cuts. As yet another alternative, all cuts between two rows of adjacent die may be done, followed by cuts between other adjacent die.

Still referring to FIG. 10, at step 1018 the superfluous glass is broken and removed. In step 1018 the glass may be broken by any appropriate method, such as the applicable methods disclosed in U.S. Pat. No. 7,378,293, or those disclosed in co-filed U.S. patent application Ser. No. 12/238,038, "Bonded Wafer Assembly System and Method." For example, pressure may be applied by hand or by any tool designed for such a purpose, either manually or automatically by machine. The removal of the broken glass is accomplished in step 1018, for example by simply turning the wafer over and letting gravity act on the superfluous glass. Alternatively, a vacuum system could also be employed to remove the broken glass. At step 1020, the devices embedded in the wafer are each tested and further processed, e.g., as described above with respect to FIG. 9.

Still referring to FIG. 10, at step 1022, following any desired testing and other processing, the devices are then completely singulated. This is typically accomplished by making complete saw cuts through the bottom wafer between each device pair and parallel to the cuts made in steps 1002-1016, as well as through both the top and the bottom wafers between each device pair in a direction roughly perpendicular to the cuts made in steps 1002-1016. Although this step typically takes place after all the devices are tested and processed, that need not always be the case. The process ends at step 1024.

Overall, the swizzle stick removal process described herein may be performed only in a single direction, removing glass in either the columns or the rows. Alternatively, the process may be performed in both directions, removing glass in a grid pattern. Furthermore, the process may remove glass between all device columns or rows on a wafer, or only between some of the devices on the wafer. For example, if there are bond pads on only one side of a device, and adjacent devices have their bond pads proximate to each other, then only every other column between devices may be removed to provide access to the bond pads.

Those skilled in the art will appreciate that modifications may be made to the described embodiments, and that other embodiments are possible, without departing from the spirit and scope of the invention as defined by the claims.

What is claimed is:

1. A semiconductor device structure, comprising:
   first and second semiconductor devices formed in laterally spaced adjacent positions on a bottom wafer, including corresponding first and second electrical contact pads formed on the bottom wafer proximate each respective device in spacing between the devices;
   a top wafer bonded to the bottom wafer at a first bond between the first device and the first contact pad and at a second bond between the second device and the second contact pad;
   a first partial cut downward into the top wafer between the first bond and at least a portion of the first contact pad, with a first tab under the first partial cut left joining a portion of the top wafer over the first device and a portion of the top wafer over the at least a portion of the first contact pad;
   a second partial cut downward into the top wafer between the second bond and at least a portion of the second contact pad, with a second tab under the second partial cut left joining a portion of the top wafer over the second device and a portion of the top wafer over the at least a portion of the second contact pad; and
   a complete cut through the top wafer between the first and the second contact pads, separating the portion of the top wafer over the at least a portion of the first contact pad from the portion of the top wafer over the at least a portion of the second contact pad, with the bottom wafer left unsingulated.

2. The structure of claim 1, wherein the first and second devices are microelectromechanical system (MEMS) devices.

3. The structure of claim 2, wherein the first and second devices are digital micromirror devices (DMDs).

4. The structure of claim 3, wherein the bottom wafer comprises silicon and the top wafer comprises glass.

5. The structure of claim 4, wherein the first and second bonds comprise first and second adhesive pads.

6. The structure of claim 1, wherein the top wafer comprises a light transparent material.

7. The structure of claim 1, wherein the bonds comprise adhesive pads.

8. The structure of claim 1, wherein the first and second devices comprise digital micromirror devices (DMDs), the bottom wafer comprises silicon, and the top wafer comprises glass.

* * * * *